United States Patent
O'Connell et al.

(10) Patent No.: US 11,153,976 B2
(45) Date of Patent: Oct. 19, 2021

(54) IMPLEMENTING IR REFLECTIVE MASK TO MINIMIZE CTE MISMATCH BETWEEN LAMINATE AND PTH COPPER

(71) Applicant: International Business Machines Corporation, Armonk, NY (US)

(72) Inventors: Kevin O'Connell, Rochester, MN (US); Mark Plucinski, Toms River, NJ (US); Timothy Tofil, Rochester, MN (US); Joseph Kuczynski, North Port, FL (US)

(73) Assignee: International Business Machines Corporation, Armonk, NY (US)

( * ) Notice: Subject to any disclaimer, the term of this patent is extended or adjusted under 35 U.S.C. 154(b) by 581 days.

(21) Appl. No.: 15/988,397

(22) Filed: May 24, 2018

(65) Prior Publication Data

US 2019/0364670 A1  Nov. 28, 2019

(51) Int. Cl.
*B23K 1/00* (2006.01)
*H05K 3/34* (2006.01)
(Continued)

(52) U.S. Cl.
CPC ......... *H05K 3/3494* (2013.01); *B23K 1/0053* (2013.01); *G02B 5/08* (2013.01)

(58) Field of Classification Search
CPC ........... H05K 3/3494; H05K 2203/304; H05K 13/0465; H05K 2201/068; H05K 3/3447; H05K 3/3468; H05K 1/0201; B23K 1/008; B23K 2101/42; B23K 1/012; B23K 3/085; B23K 1/0053; B23K 1/0016; B23K 1/018;
(Continued)

(56) References Cited

U.S. PATENT DOCUMENTS 3,429,733 A  2/1969 Wolf et al.
3,583,063 A  6/1971 Growney
(Continued)

FOREIGN PATENT DOCUMENTS

DE  3839396 A1  5/1990
JP  04067697 A  *  3/1992
(Continued)

OTHER PUBLICATIONS

English computer translation (Year: 1992).*
(Continued)

*Primary Examiner* — Erin B Saad
(74) *Attorney, Agent, or Firm* — Kelsey M. Skodje

(57) ABSTRACT

A method and structure are provided for implementing manufacture of a printed circuit board (PCB) with one of an infrared (IR) reflective mask or a novel solder mask to minimize coefficient of thermal expansion (CTE) mismatch between PCB laminate and plated through hole (PTH) copper. At least one of an IR-reflective mask and a solder mask composition for use in IR reflow processes is created such that radiant heat is reflected away from the major portion of the PCB yet permitted to impinge upon the PTHs. The copper within the PTH expands due to radiant heating while the bulk laminate expansion is significantly reduced due to the reflected IR radiation. Consequently, the CTE mismatch is minimized and tensile strain of the copper in the PTH is reduced, providing enhanced reliability.

17 Claims, 4 Drawing Sheets

(51) Int. Cl.
    *B23K 1/005* (2006.01)
    *G02B 5/08* (2006.01)
(58) Field of Classification Search
    CPC .. B23K 37/0443; B23K 3/087; B23K 1/0012;
        B23K 1/005; B23K 1/085; B23K
        2101/40; B23K 3/0315; B23K 3/04;
        B23K 3/0653
    See application file for complete search history.

(56) References Cited

U.S. PATENT DOCUMENTS

| | | | |
|---|---|---|---|
| 5,128,506 | A | 7/1992 | Dahne et al. |
| 6,278,601 | B1 | 8/2001 | Price |
| 8,598,714 | B2 | 12/2013 | Huisinga et al. |
| 9,281,269 | B2 | 3/2016 | Williamson et al. |
| 9,786,559 | B2 | 10/2017 | Zimmerman et al. |
| 2010/0028690 | A1* | 2/2010 | Parks ........................ C09D 7/43 |
| | | | 428/418 |
| 2014/0034375 | A1* | 2/2014 | Kuczynski ............ H05K 3/421 |
| | | | 174/266 |
| 2015/0228555 | A1 | 8/2015 | Rabie et al. |
| 2016/0315069 | A1 | 10/2016 | Rong et al. |

FOREIGN PATENT DOCUMENTS

| | | | |
|---|---|---|---|
| JP | 2001313462 | A1 | 11/2001 |
| JP | 2012074451 | A1 | 4/2012 |

OTHER PUBLICATIONS

"CNF—Mask Making Equipment Resources", Cornell Nanoscale Science and Technology Facility (CNF), 2015, 2016 http://www.cnf.cornell.edu/cnf_process_mask_equipment.html.

"Introduction to IR-Reflective Pigments", PCI Paint & Coating Industry, 2018 https://www.pcimag.com/articles/83468-introduction-to-ir-reflective-pigments.

* cited by examiner

IMPLEMENTING IR REFLECTIVE MASK TO MINIMIZE CTE MISMATCH BETWEEN LAMINATE AND PTH COPPER

FIELD OF THE INVENTION

The present invention relates generally to the data processing field, and more particularly, relates to a method and structure for implementing manufacture of a printed circuit board (PCB) with infrared (IR) reflective mask to minimize coefficient of thermal expansion (CTE) mismatch between PCB laminate and plated through hole (PTH) copper.

DESCRIPTION OF THE RELATED ART

Thermal fatigue of PTH barrels is a significant issue in electronics reliability. The difference in coefficients of thermal expansion between the metal plating of the through hole and the laminate, typically a fiberglass/epoxy resin composite, causes a large enough strain in the embedded copper structures to induce a fatigue failure mode during thermal cycling or solder reflow operations.

Recent modelling work has shown that at temperatures approaching 300° C. (lead-free solder reflow temperature=265° C.), the copper in the PTH will expand approximately 0.5% whereas the resin in the PCB will expand >2.0%. This difference in CTE drives stress into the plated copper and can result in barrel cracks.

A need exists for a method and structure for implementing manufacture of a printed circuit board (PCB) minimizing coefficient of thermal expansion (CTE) mismatch between PCB laminate and plated through hole (PTH) copper.

As used in the following description and claims, the term printed circuit board (PCB) should be understood to broadly include a printed wiring board or other substrate, an interconnect substrate, and various substrates including a plurality of vias or plated through holes (PTHs), one or more laminate layers, and copper layers.

SUMMARY OF THE INVENTION

Principal aspects of the present invention are to provide a method and structure for implementing manufacture of a printed circuit board (PCB) with an infrared (IR) reflective mask to minimize coefficient of thermal expansion (CTE) mismatch between PCB laminate and plated through hole (PTH) copper. Other important aspects of the present invention are to provide such method and structure substantially without negative effects and that overcome many of the disadvantages of prior art arrangements.

In brief, a method and structure are provided for implementing manufacture of a printed circuit board (PCB) with one of an infrared (IR) reflective mask or a novel solder mask to minimize coefficient of thermal expansion (CTE) mismatch between PCB laminate and plated through hole (PTH) copper. At least one of an IR-reflective mask and a solder mask composition for use in IR reflow processes is created such that radiant heat is reflected away from the major portion of the PCB yet permitted to impinge upon the PTHs. The copper within the PTH expands due to radiant heating while the bulk laminate expansion is significantly reduced due to the reflected IR radiation. Consequently, the CTE mismatch is minimized and tensile strain of the copper in the PTH is reduced, providing enhanced reliability.

In accordance with features of the invention, an IR-reflective mask includes an IR reflective coating on all regions other than the PTHs. The IR-reflective mask is laid over the completed printed circuit assembly (PCA) prior to solder reflow operations in an IR oven. As a result, only the PTHs are rapidly heated whereas the laminate expansion is substantially reduced as the bulk of the assembly is effectively shielded from the IR radiation. This tends to equalize expansion of the copper in the PTH barrel with the laminate and reduce tensile stress on the copper, thereby enhancing reliability.

In accordance with features of the invention, a solder mask composition for use in IR reflow processes includes an IR reflective compound in a solder mask composition of matter. The novel, IR-reflective compound containing solder mask is processed using standard photolithography processes known to those skilled in the art in the manufacture of a PCB.

In accordance with features of the invention, various IR reflective coatings with IR-reflective-pigments can be used. For example, pigment Yellow 10C272 boasts a total solar reflectance of 71%. If this is further compounded with $TiO_2$, an even higher total solar reflectance (TSR) can be achieved.

In accordance with features of the invention, the IR radiation incident upon the IR reflective mask are reflected off of the PCA whereas those incident upon the copper in the PTH barrel heat the copper. Although not all of the incident IR radiation can be reflected from the laminate, the rate at which the copper in the PTH expands relative to that of the bulk laminate is greatly increased and serves to offset the total expansion mismatch thereby increasing PTH reliability through soldering operations.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structure are provided for implementing manufacture of a printed circuit board (PCB) to minimize coefficient of thermal expansion (CTE) mismatch between PCB laminate and plated through hole (PTH) copper in accordance with the preferred embodiment.

Figure 1:
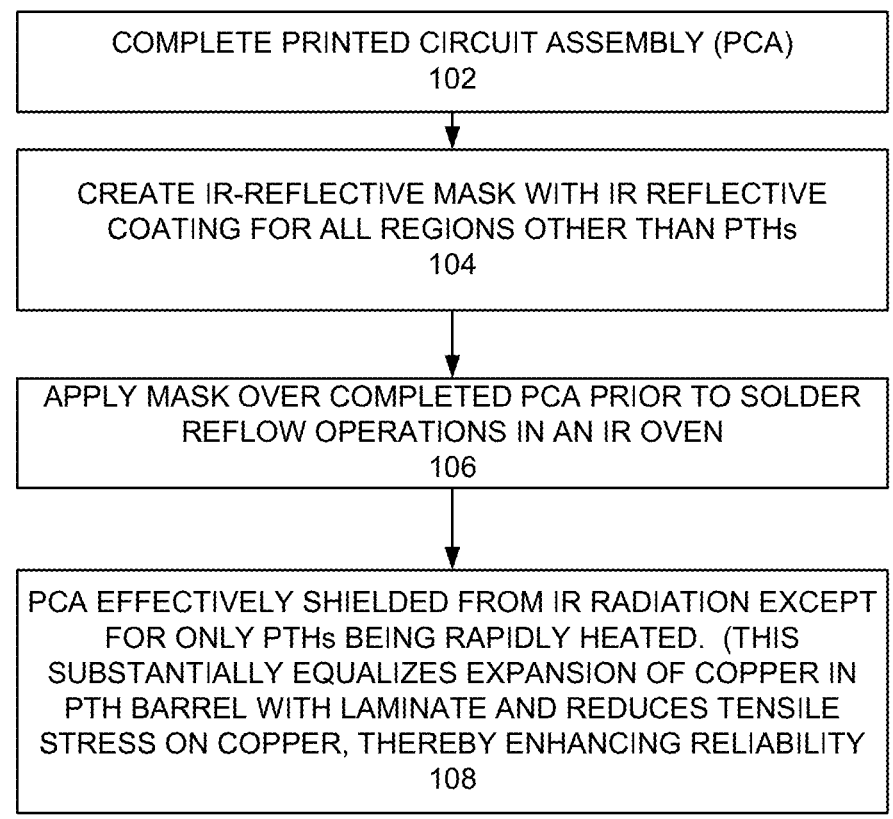
FIGS. 1A and 1B provide a respective flow chart illustrating example steps for implementing a method and structure for manufacture of a printed circuit board (PCB) to minimize coefficient of thermal expansion (CTE) mismatch between PCB laminate and plated through hole (PTH) copper in accordance with the preferred embodiment.

Having reference now to the drawings, in FIGS. 1A and 1B there are shown respective flow charts illustrating example steps for implementing a method and structure for manufacture of a printed circuit board (PCB) to minimize coefficient of thermal expansion (CTE) mismatch between PCB laminate and plated through hole (PTH) copper in accordance with the preferred embodiments.

In FIG. 1A, example steps generally designated by reference character 100 for implementing manufacture of a printed circuit board (PCB) to minimize CTE mismatch between PCB laminate and PTH copper using an IR-reflective mask includes an IR reflective coating for all regions other than the PTHs. As indicated at a block 102, a printed circuit assembly (PCA) is completed.

As indicated at a block 104, an IR-reflective mask is created with IR reflective coating for all regions of the completed PCA except for the PTHs. As indicated at a block 106, the IR-reflective mask is laid over the completed printed circuit assembly (PCA) prior to solder reflow operations in an IR oven.

As indicated at a block 108, the PCA is effectively shielded from IR radiation except for only the PTHs being rapidly heated. As a result, only the PTHs are rapidly heated whereas the laminate expansion is substantially reduced with the bulk of the assembly being effectively shielded from the IR radiation. This substantially equalizes expansion of the copper in the PTH barrel with the laminate and reduces tensile stress on the copper, thereby enhancing reliability.

Referring now to FIG. 1B, example steps generally designated by reference character 110 for implementing manufacture of a printed circuit board (PCB) to minimize CTE mismatch between PCB laminate and PTH copper using a novel solder mask composition in IR reflow processes. As indicated at a block 112, the novel solder mask composition is an IR-reflective compound containing solder mask that is processed using standard photolithography processes known to those skilled in the art in the manufacture of a PCB.

Figure 2:
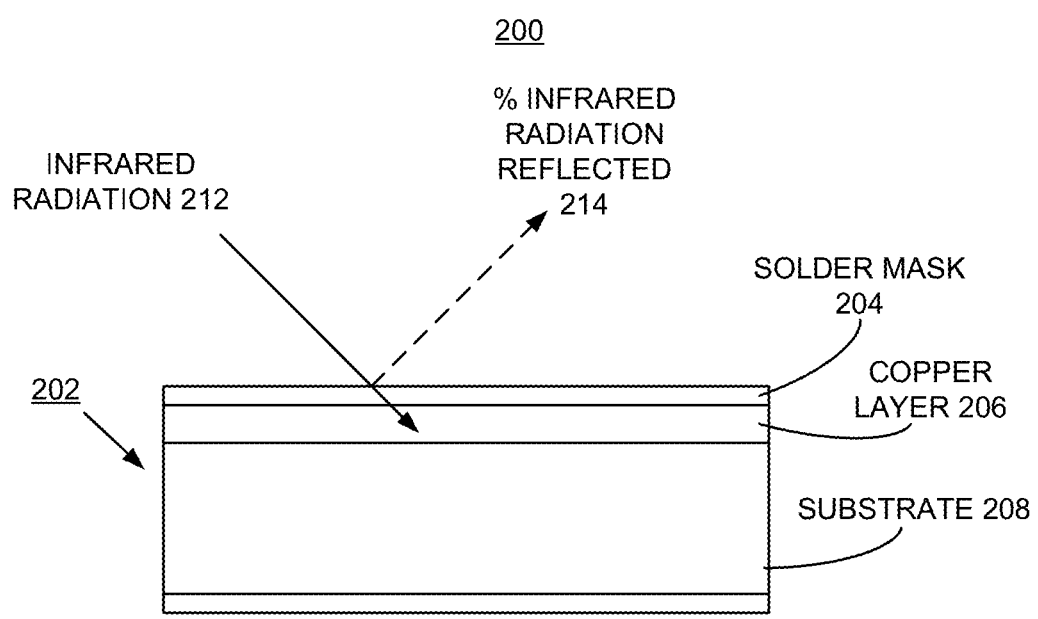
FIG. 2 illustrates an example structure for manufacturing a printed circuit board (PCB) with a solder mask to minimize coefficient of thermal expansion (CTE) mismatch between PCB laminate and plated through hole (PTH) copper in accordance with the preferred embodiment.

Referring to FIG. 2, there is shown an example structure generally designated by reference character 200 for manufacturing a printed circuit board (PCB) with a novel solder mask to minimize coefficient of thermal expansion (CTE) mismatch between PCB laminate and plated through hole (PTH) copper in accordance with the preferred embodiment. Structure 200 includes a printed circuit board (PCB) generally designated by reference character 202 and includes a novel solder mask 204 in accordance with a preferred embodiment, a copper layer 206, and a substrate 208. The novel solder mask 204 includes a novel solder mask composition of matter including an IR-reflective compound. A standard solder mask is simply replaced by the novel, IR-reflective compound containing solder mask 204 that is processed using standard photolithography processes known to those skilled in the art. Operation of the novel, IR-reflective compound containing solder mask 204 is illustrated by a solid arrow labeled infrared radiation 212 with a dashed arrow labeled infrared radiation reflected 214.

Figure 3:
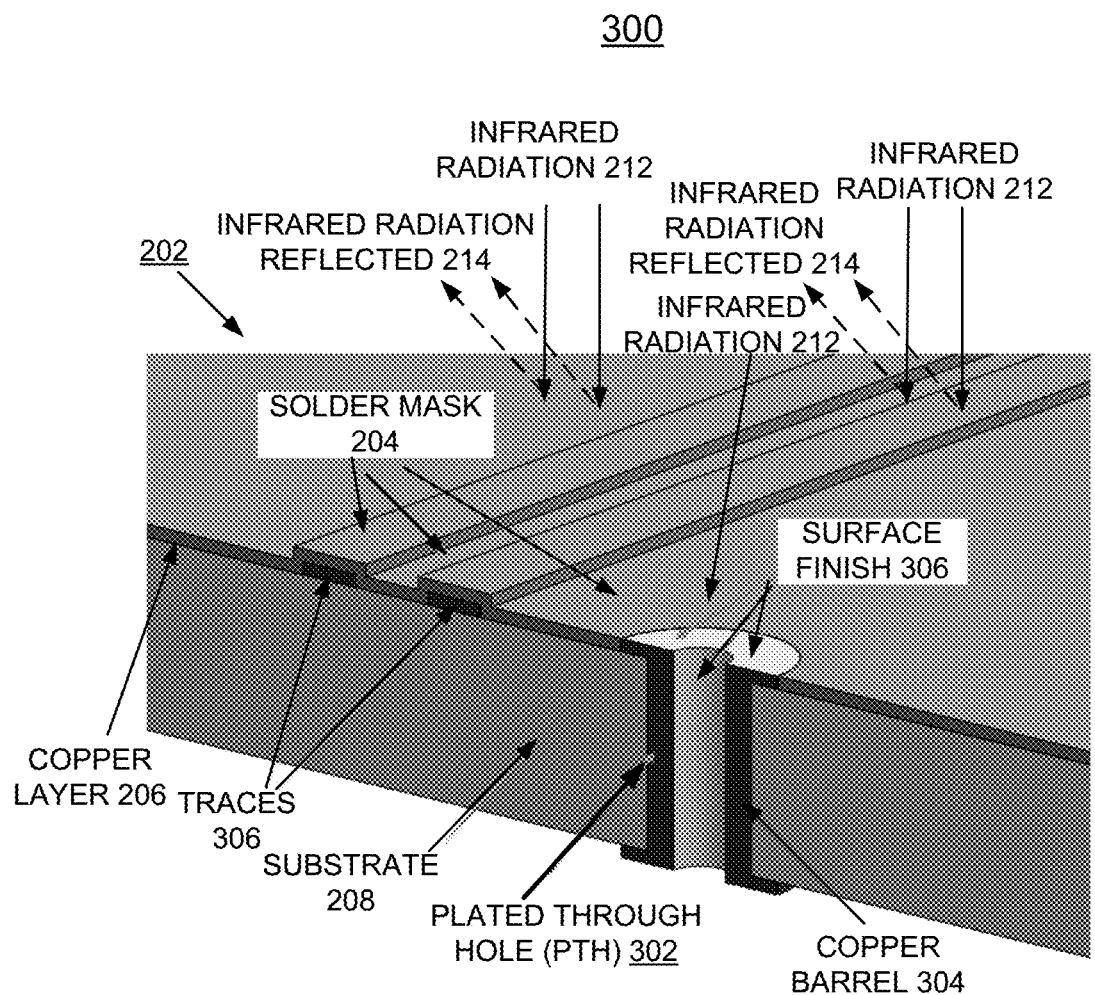
FIG. 3 is an example structure for manufacturing a printed circuit board (PCB) with an infrared (IR) reflective mask to minimize coefficient of thermal expansion (CTE) mismatch between PCB laminate and plated through hole (PTH) copper in accordance with the preferred embodiment.

Referring to FIG. 3, there is shown an example structure detail generally designated by reference character 300 for manufacturing the printed circuit board (PCB) 202 to minimize coefficient of thermal expansion (CTE) mismatch between PCB laminate or substrate 208 and plated through hole (PTH) copper in accordance with a preferred embodiment. Shown in the structure detail 300 includes the solder mask in accordance with a preferred embodiment, the copper layer 206, and substrate 208. Structure detail 300 illustrates a plated through hole (PTH) 302, a copper barrel 304 and a surface finish 306 of the plated through hole (PTH) 302. Structure detail 300 illustrates a pair of traces 306 with the novel solder mask 204 of a preferred embodiment. As shown in FIG. 2, solid arrows labeled infrared radiation 212 with dashed arrows labeled infrared radiation reflected 214 illustrates operation of the novel, IR-reflective compound containing solder mask 204, while solid arrow labeled infrared radiation 212 contacting the PTH 302 is absorbed heating the PTH 302 without any infrared radiation being reflected.

In accordance with features of the invention, when the novel solder mask composition 204 is use in IR reflow processes radiant heat is reflected away from the major portion of the PCB 202 yet permitted to impinge upon the PTHs 302. The copper 304, 306 within the PTH 302 expands due to radiant heating and the bulk laminate expansion is substantially reduced due to the reflected IR 214. Consequently, the CTE mismatch is minimized and tensile strain of the copper 304 in the PTH 302 is reduced, increasing reliability.

Figure 4:
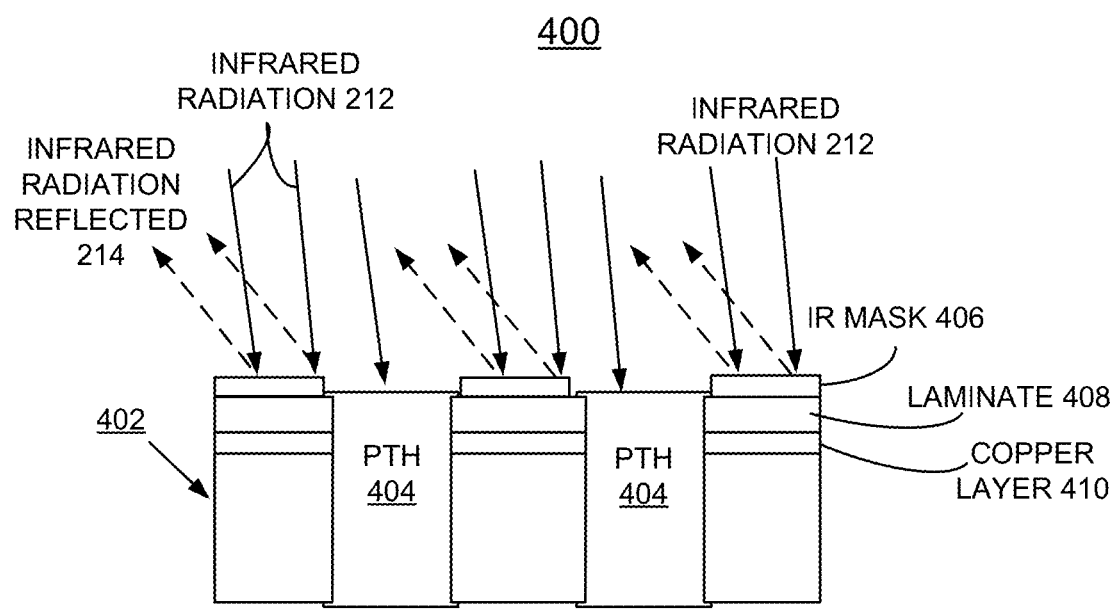
FIG. 4 illustrates an example structure for manufacturing a printed circuit board (PCB) to minimize coefficient of thermal expansion (CTE) mismatch between PCB laminate and plated through hole (PTH) copper in accordance with the preferred embodiment.

Referring to FIG. 4, there is shown another example structure generally designated by reference character 400 for manufacturing a printed circuit board (PCB) or other laminate with an infrared (IR) reflective mask to minimize coefficient of thermal expansion (CTE) mismatch between PCB laminate and plated through hole (PTH) copper in accordance with a preferred embodiment. Structure 400 includes a printed circuit board (PCB) generally designated by reference character 402 having PTHs 404, and IR mask 406 in accordance with a preferred embodiment, at least one laminate layer 408, and at least one copper layer 410.

In FIG. 4, the IR radiation 212 incident upon the IR reflective mask 406 is reflected off of the PCA, as indicated by arrows labeled IR radiation reflected 214, whereas the IR radiation 212 incident upon the PTH copper barrel 404 heats the copper. Although not all of the incident IR radiation can be reflected from the laminate, the rate at which the PTH copper 404 expands relative to that of the bulk laminate 408 is greatly increased and serves to offset the total expansion mismatch thereby increasing PTH reliability through soldering operations.

Example fabrication of the IR mask 406 is provided at: (http://www.cnf.cornell.edu/cnf_process_mask_equipment.html), by Cornell Nanoscale Science and Technology Facility, as follows:

Optical lithography requires the fabrication of a mask. Generally, photomasks consist of a piece of glass of some type, coated with a film in which the pattern is formed. A layer of sputtered Cr about 100 nm thick coats the glass plate. Resist is then spun on the plate, and the exposure is made. After development, the Cr is removed from the unprotected areas with an acid etch, and an image of the pattern is left in the Cr. The exposure can be made with either an optical or an electron beam lithography tool. Once the pattern is formed, a second, IR reflective coating is applied to those regions of the glass master that do not define the PTHs. Various IR reflective coatings can be used, such as found at: (https://www.pcimag.com/articles/83468-introduction-to-ir-reflective-pigments).

For example, as described in the cited article above:

Shepherd Color Company supplies pigment to the high-performance coatings market. These products, including the Arctic line, are highly engineered ceramic pigments. These pigments, also called mixed metal oxides (MMO) or complex inorganic colored pigments (CICP), provide lasting color for demanding applications. The inorganic ceramic nature of the pigments provides resistance to high temperatures, chemicals, acids, bases, weathering and environmental pollutants.

The highest reflective pigments should be chosen for cool coatings. Carbon black, iron oxide black or copper chromite black are standard black pigments for most formulations, but they have very low infrared reflectivity and a TSR of about 6%. One key to formulating cool coatings is the use of an infrared-reflecting black pigment. In general, IR-reflective formulations incorporate Arctic Black 10C909 to lower the L value in colors made with the other Arctic colors. Black 411 provides a higher TSR, but with a redder undertone. A complete listing of Arctic pigments in Table 1, provided in the above cited Uniform Resource Locator (URL) for IR reflective coatings, provides a nearly full color gamut to use to help formulate high-IR-reflective coatings. This advantage in TSR continues when the pigments are added with $TiO_2$ to make tints.

In accordance with features of the invention, with either an IR-reflective mask 406 as illustrated in FIG. 4 or solder mask composition 204 as shown in FIGS. 2 and 3, used in IR reflow processes such that radiant heat is reflected away from the major portion of the PCB 202, 402 yet permitted to impinge upon the PTHs 302, 404. The copper within the PTH 302, 404 expands due to radiant heating but the bulk laminate expansion is much reduced due to the reflected IR. Consequently, the CTE mismatch is minimized and tensile strain of the PTH copper is significantly reduced.

While the present invention has been described with reference to the details of the embodiments of the invention shown in the drawing, these details are not intended to limit the scope of the invention as claimed in the appended claims.

What is claimed is:

1. A method for implementing enhanced manufacture of a printed circuit board (PCB) to minimize coefficient of thermal expansion (CTE) mismatch between PCB laminate and plated through hole (PTH) copper comprising:
   providing a photomask;
   etching a pattern onto the photomask, wherein the pattern defines regions for a plated through hole (PTH) copper to extend through the PCB and regions that are not for the PTH copper to extend through the PCB;
   forming an IR-reflective mask, wherein the forming comprises:
      coating the regions that are not for the PTH copper to extend through the PCB with an IR-reflective coating; and
   applying the IR-reflective mask to the PCB for IR reflow processes.

2. The method as recited in claim 1 further comprising providing the IR-reflective mask and a novel solder mask for use in the IR reflow processes.

3. The method as recited in claim 1 wherein the applying the IR-reflective mask is prior to solder reflow operations in an IR oven.

4. The method as recited in claim 1 wherein the IR reflective coating comprises one or more IR-reflective pigments.

5. The method as recited in claim 4 wherein the IR-reflective pigments include at least one material from the group consisting of selected mixed metal oxides (MMO) and selected complex inorganic colored pigments (CICP).

6. The method as recited in claim 5 wherein the IR reflective coating further comprises $TiO_2$.

7. The method as recited in claim 1 wherein the IR reflective mask is applied to the PCB prior to solder reflow operations in an IR oven.

8. The method as recited in claim 1 wherein the forming the IR-reflective mask includes providing a novel solder mask.

9. The method as recited in claim 8 wherein providing said novel solder mask includes providing an IR reflective compound in a solder mask composition of matter.

10. The method as recited in claim 8 wherein providing said novel solder mask includes applying said novel solder mask to the PCB prior to solder reflow operations in an IR oven.

11. The method as recited in claim 8 wherein providing said novel solder mask includes processing the manufacture of the PCB using standard photolithography processes.

12. A structure for implementing enhanced manufacture of a printed circuit board (PCB) to minimize coefficient of thermal expansion (CTE) mismatch between PCB laminate and plated through hole (PTH) copper comprising:
   a printed circuit board (PCB);
   an IR-reflective mask applied to the PCB for IR reflow processes, the IR-reflective mask comprising:
      a photomask having an etched pattern that defines regions for plated through hole (PTH) copper to extend through the PCB and regions that are not for the PTH copper to extend through the PCB; and
      an IR-reflective coating on the regions that are not for the PTH copper to extend through the PCB.

13. The structure as recited in claim 12 wherein the IR-reflective mask and a novel solder mask are for use in the IR reflow processes.

14. The structure as recited in claim 13 wherein said IR-reflective mask is applied to the PCB prior to solder reflow operations in an IR oven.

15. The structure as recited in claim 13 wherein the IR reflective coating includes one or more IR-reflective pigments.

16. The structure as recited in claim 15 wherein said IR reflective coating is compounded with $TiO_2$.

17. The structure as recited in claim 13 wherein said novel solder mask includes an IR reflective compound in a solder mask composition of matter.

* * * * *